United States Patent [19]

Okutsu

[11] 4,410,580
[45] Oct. 18, 1983

[54] SEMICONDUCTOR WAFER

[75] Inventor: Kinnosuke Okutsu, Oita, Japan

[73] Assignee: Tokyo Shibaura Electric Co., Ltd., Japan

[21] Appl. No.: 94,562

[22] Filed: Nov. 15, 1979

Related U.S. Application Data

[63] Continuation of Ser. No. 882,154, Feb. 28, 1978, abandoned, which is a continuation-in-part of Ser. No. 738,951, Nov. 4, 1976, abandoned.

[30] Foreign Application Priority Data

Nov. 6, 1975 [JP] Japan .................................. 50-133417

[51] Int. Cl.³ ............................ B32B 3/00; B32B 9/04
[52] U.S. Cl. ..................................... 428/156; 357/40; 427/82; 427/93; 427/272; 428/447; 428/901; 430/5

[58] Field of Search .......................... 427/82, 93, 272; 357/40; 428/156, 447, 901; 148/1.5; 430/5

[56] References Cited

U.S. PATENT DOCUMENTS

| 3,442,011 | 5/1969 | Strieter ................... 427/82 |
| 3,453,723 | 7/1969 | Cecil ....................... 357/40 |
| 3,476,617 | 11/1969 | Robinson ................ 427/82 |
| 3,502,515 | 3/1970 | McMullin et al. ...... 427/82 |
| 3,578,515 | 5/1971 | Borrello et al. ........ 427/82 |

Primary Examiner—Thomas J. Herbert, Jr.
Attorney, Agent, or Firm—Finnegan, Henderson, Farabow, Garrett & Dunner

[57] ABSTRACT

A semiconductor wafer is provided having a plurality of projections along the dicing lines of the wafer surrounding each area on which an integrated circuit is formed, the projections being spaced apart.

8 Claims, 13 Drawing Figures

SEMICONDUCTOR WAFER

This is a continuation of application Ser. No. 882,154 filed Feb. 28, 1978, (now abandoned) which was a continuation-in-part of application Ser. No. 738,951, filed Nov. 4, 1976, (now abandoned).

BACKGROUND OF THE INVENTION

The present invention relates to a semiconductor wafer.

Conventionally, the photographic engraving process used for fabrication of integrated circuits is performed, for example, in the following manner: A semiconductor wafer, or substrate, is coated with photoresists; a mask having a predetermined pattern is disposed on the photoresist coated wafer; that wafer is finally irradiated by ultraviolet light, through the mask.

A conventional wafer used for forming integrated circuits thereon has a planar surface. When a mask is disposed on such a planar surface in the photographic engraving process, there is no path to permit the atmosphere confined between the planar surface and the mask to escape, so that it is impossible to rapidly dispose the mask on the wafer. Additionally, when ultraviolet light is focused onto the wafer through the mask, the photoresist emits gases. However, such a wafer construction provides no path for the gas to escape. Thus, the gas is confined between the mask and the wafer so that the mask possibly floats from the wafer. The result of this is that the irradiation area of ultraviolet light through the mask holes is extended and thus the regions of the wafer to be removed are removed imprecisely. Further, in the conventional case, the mask comes in intimate contact with the wafer. Accordingly, when dust or foreign materials are attached to the wafer, the mask and the photoresist coated on the wafer are injured with the result that the integrated circuits obtained are defective. These problems become very serious in the case of large scale integration requiring a high precision in size.

SUMMARY OF THE INVENTION

Accordingly, an object of the present invention is to provide a semiconductor wafer permitting a rapid and highly precise disposition of the mask on the wafer on which integrated circuits are formed in the photographic engraving process for integrated circuit formation.

According to the present invention, there is provided a semiconductor wafer having a plurality of projections along the dicing lines of the wafer surrounding each area on which an integrated circuit is formed, the projections being spaced apart.

Many advantages effects are attained by the present invention. The first is the rapid disposition of the mask on the wafer due to the fact that the atmosphere confined between the mask and the wafer escapes through the spaces defined by the projections. The second is that floating of the mask from the wafer is prevented, since the gas evolved from the photoresist escapes through the spaces defined by the projections. Therefore, the regions of the wafer to be removed are removed precisely. The third is that the photoresist is prevented from being injured even if dust or foreign materials are attached to the wafer. This is because the mask does not intimately contact the wafer. Therefore, the possibility that defective integrated circuits are produced is greatly reduced.

DETAILED DESCRIPTION OF THE PREFERRED EMBODIMENTS

Figure 1:
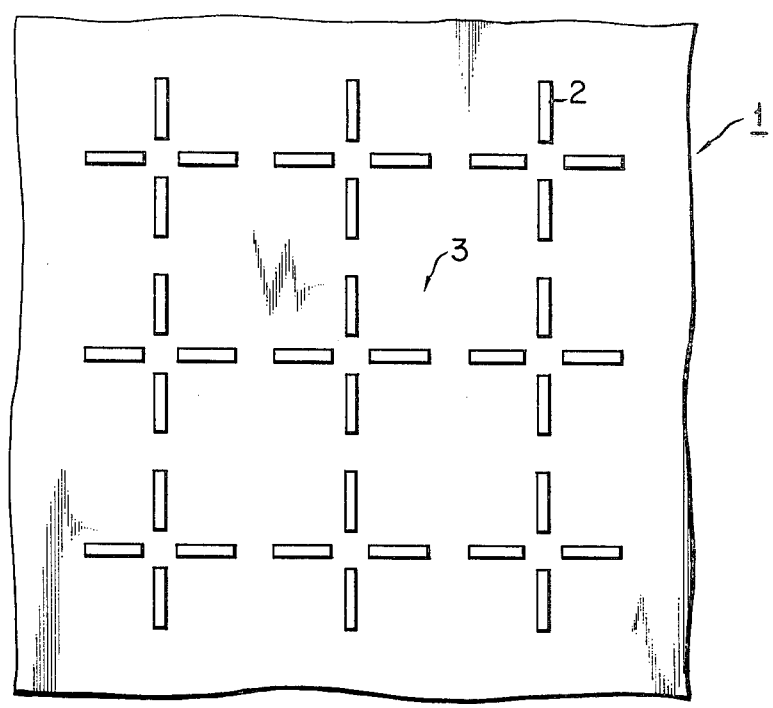
FIG. 1 shows a plan view of an embodiment of a semiconductor wafer according to the present invention.
Figure 2:
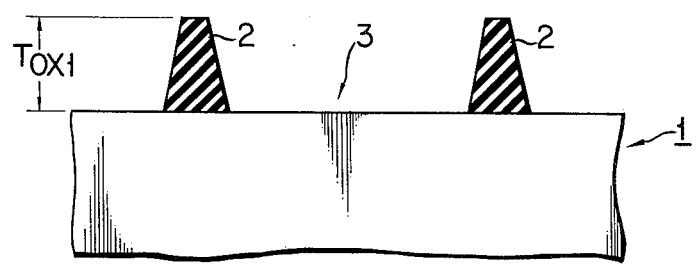
FIG. 2 is a cross-sectional view of a part of the semiconductor wafer shown in FIG. 1.

Throughout the accompanying drawings, like reference numerals will be used to indicate like portions or equivalents. Reference is first made to FIG. 1. In the figure, discrete projections 2 spaced apart from each other are formed on a wafer 1 along the dicing lines thereon defining the area 3 on which an integrated circuit is formed. It is to be noted here that only two projections 2 are illustrated in FIG. 2 since FIG. 2 is a fragmentary cross-sectional view of the wafer 1 shown in FIG. 1 on which a number of projections are disposed. The number of projections used and the spacing of the projections may be varied as desired as long as the number of projections used and their spacing is sufficient to support a mask above the surface of the wafer and to permit escape of gases emitted during processing of the wafer.

The discussion to follow is the fabrication process of the semiconductor wafer 1 shown in FIGS. 1 and 2.

Figure 3A:
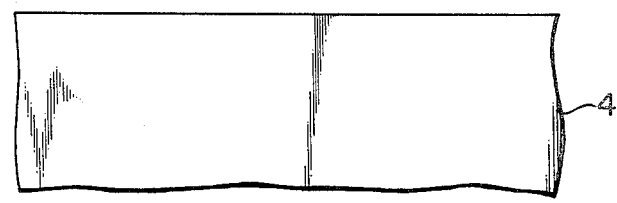
FIGS. 3(A) to (C) show a series of views illustrating the sequence of processing for fabricating the wafer of FIGS. 1 and 2.
Figure 3B:
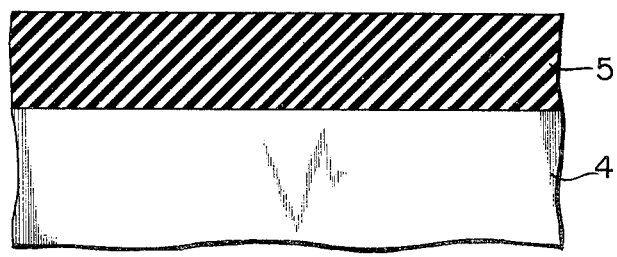
Figure 3C:
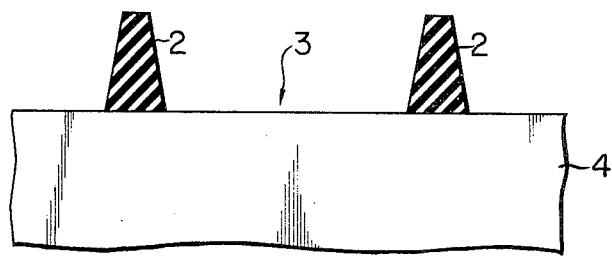

To start, a semiconductor substrate, for example, a silicon substrate 4, is prepared, as shown in FIG. 3(A), and an oxide film 5, for example, a silicon dioxide film, is formed over the entire surface of the substrate 4 by means of a conventional thermal oxidation process, for example (FIG. 3(B)). Following this, unnecessary portions of the oxidation film 5 are removed through a conventional photographic engraving process, thereby forming the projections 2 of the oxidation film spaced apart from each other on the dicing lines of the substrate 4, as shown in FIG. 3(C). Through the processing steps mentioned above, the wafer 1 with the projections 2 thereon as shown in FIGS. 1 and 2 is formed. Incidentally, the size precision required for the projections 2 of the oxidation film may be less strict than that for the integrated circuits to be formed on the areas 3. The reason why the projections 2 are formed on the dicing lines is to eliminate the possibility of damage to the wiring of the integrated circuits to be formed on the areas 3.

Figure 4:
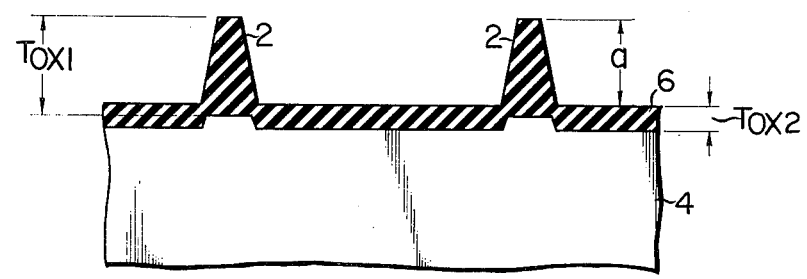
FIG. 4 shows in cross section the wafer of FIG. 1 with an oxidation film formed thereon.
Figure 5:
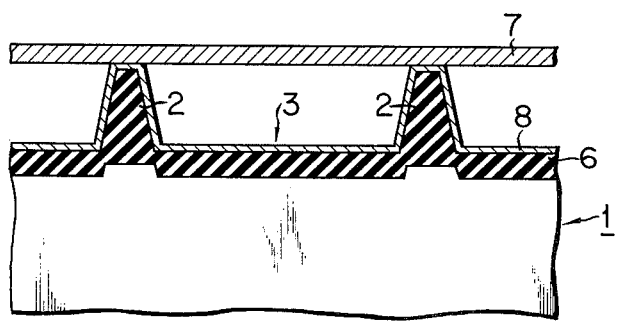
FIG. 5 shows in cross section the wafer of FIG. 1 with a mask disposed thereon.

The height of the oxidation film projection 2, i.e., the thickness Tox1, is preferably more than 1.5 $\mu$m. More specifically, when integrated circuits are to be formed on the areas 3 of the wafer 1, an oxidation film 6 is first formed over the entire surface of the wafer 1, as shown in FIG. 4. The thickness Tox2 of the oxidation film 6 is normally less than 1 $\mu$m. The establishment of more than 1.5 μm of the projection thickness Tox1 provides a thickness difference of more than 0.5 μm between the projection 2 and the oxidation film 6. Such a thickness difference is enough to exhaust the atmosphere in the space confined between the wafer 1 and a mask if it is mounted on the wafer 1, and to exhaust the gas generated from the photoresist coated on the wafer surface when such a wafer is irradiated by ultraviolet light.

In formation of the oxidation film 6 on the wafer surface, oxidation progresses more slowly under the projections 2 than other portions. The result of this is that the thickness of the oxidation film 6 under the projections 2 is thinner than the other portions.

The term dicing line, as used in the present specification and as well-known in the art, denotes a line along which a chip containing an integrated circuit is cut off from a semiconductor wafer. Namely, a plurality of integrated circuits are formed independently on a single wafer and each chip containing one integrated circuit is cut off along the dicing lines. Referring to FIG. 1, a series of projections 2, formed on dicing lines, define four areas 3 on semiconductor wafer 1. An integrated circuit is formed within each of the areas 3 and then area 3 is cut off along the dicing lines so as to obtain a semiconductor chip.

The shapes of the semiconductor wafer and integrated circuits formed thereon form no part of the present invention. The present invention is thus applicable to all conventionally-produced semiconductor wafers, regardless of shape, and to well-known integrated circuits formed thereon, regardless of shape. Normally the integrated circuit chips are of rectangular or square shape, however, since it is easier in practice to cut off integrated circuit chips from a semiconductor wafer along straight dicing lines.

The semiconductor substrate material similarly forms no part of the present invention. The present invention is thus applicable to all conventional semiconductor wafers, regardless of the substrate material. A conventional substrate material is silicon. Other substrate materials, however, are germanium, gallium arsenide and gallium phosphide. Conventional semiconductor substrate materials are known to one of ordinary skill in the art and require no special characteristics for use in the present invention.

The material used for forming the oxide film on the semiconductor substrate likewise forms no part of the present invention. The present invention is thus applicable to all conventional semiconductor wafers, regardless of the oxide film used. Any conventional material used for forming an oxidation film on the surface of a semiconductor substrate can be used in the present invention. An exemplary conventional material is silicon dioxide.

Silicon dioxide is normally used for forming an oxidation film on semiconductor substrates formed of the materials described above, i.e., silicon, germanium, gallium arsenide and gallium phosphide. Where germanium, gallium arsenide, or gallium phosphide is the semiconductor substrate material, a silicon dioxide film is formed thereon, for example, by conventional thermal decomposition techniques known in the art.

The selection of suitable oxidation film materials for use with various semiconductor substrate materials forms no part of the present invention, such being well-known and apparent to the artisan of ordinary skill in the semiconductor art. The projections may be formed of any oxidation film used in the fabrication of the semiconductor wafer, as to this embodiment of the invention.

With the wafer 1 of the present invention mentioned above, the engraving process to be performed in the fabrication of the integrated circuits on the wafer 1 is greatly improved. More specifically the disposition of the mask 7 is rapidly done, since the space between adjacent projections 2 permits the atmosphere confined in the space between the wafer 1 and the mask 7 to escape out. As mentioned above, when the mask 7 is disposed over the wafer 1 with photoresist coated thereover and the wafer is irradiated by ultraviolet light, the photoresist may emit gases. In such a case, the spaces provide paths to permit the gas to escape. Therefore, the floating of the mask 7 due to the gas evolved is eliminated so that the size precision on the removed portions is improved. Further, when integrated circuits are formed on the areas 3, if dust or foreign materials are attached to the areas, since the mask 7 does not come in intimate contact with the areas 3, there is no possibility that the mask 7 and the photoresist 8 are injured, thus resulting in a great reduction of the possibility that the integrated circuits formed are injured or defective.

Figure 6:
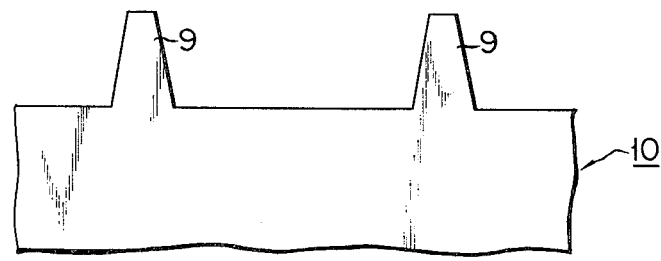
FIG. 6 is another embodiment of the semiconductor wafer according to the present invention.

While the embodiment mentioned above uses the oxidation film for production of the projections 2, any other suitable material may be used for it, for example, such projections may be formed by engraving the substrate to form projections, as shown in FIG. 6 in which the projections formed are designated by reference numeral 9. Description is followed to explain the process for manufacturing the wafer 10 shown in FIG. 6.

Figure 7A:
FIGS. 7(A) to (E) illustrate the sequence of processing for fabricating the wafer in FIG. 6.
Figure 7B:
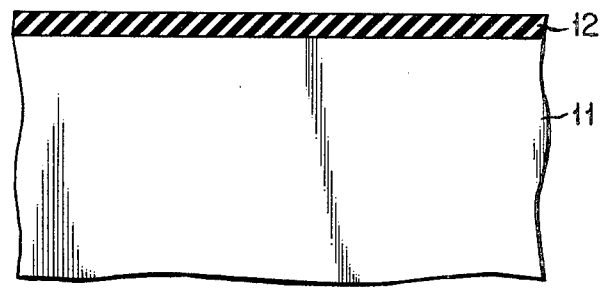
Figure 7C:
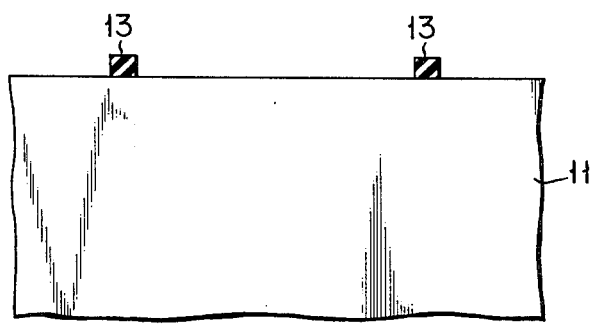
Figure 7D:
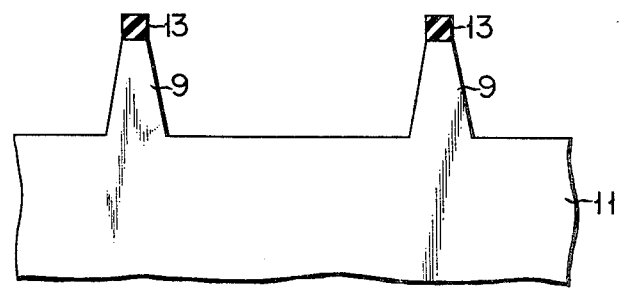
Figure 7E:
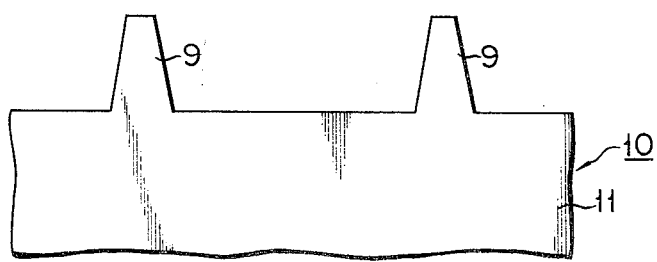

First, a substrate 11 of, for example, silicon, is prepared, as shown in FIG. 7(A). Then, an oxidation film 12 of, for example, silicon dioxide, is formed over the entire surface of the substrate 11, as shown in FIG. 7(B). The wafer thus formed is subjected to the photoengraving process and, through the engraving process, unnecessary portions of the oxidation film 12 are removed, while leaving necessary portions 12 (see FIG. 7(C)). The next step is to photographically engrave the substrate 11 to form projections 9 as shown in FIG. 7(D). After this photo-engraving process, another engraving is used to remove the oxidation portions 13 from the tops of the projections 9, thereby completing the wafer 10 as shown in FIG. 7(E), and also in FIG. 6.

The embodiment illustrated by FIGS. 6 and 7A to 7E illustrates the situation where projections are formed from part of the semiconductor substrate material. On the other hand, the embodiment illustrated by FIGS. 3A to 3C show the steps of forming projections from an oxide film material, for example silicon dioxide, differing from the substrate material. In short, the projections and substrate are of the same material in the FIG. 6 embodiment. If, for example, a silicon substrate is used, the projections are also formed of silicon. In the FIG. 2 embodiment, however, the projections are made of an oxide film, normally silicon dioxide, and are formed on, for example, a silicon substrate.

It will be apparent to those skilled in the art that the second embodiment just mentioned may achieve the same advantageous effects as those obtained in the first embodiment of the present invention mentioned previously.

What is claimed is:

1. A semiconductor wafer for having formed thereon a plurality of integrated circuits by the use of masks and photo-engraving processes, said wafer comprising:

a substrate including a plurality of areas for the formation of said integrated circuits and dicing lines surrounding each of said areas; and a plurality of projections formed along said dicing lines to support a said mask above the surface of said area, said projections (1) being formed either from an oxidation film formed on said substrate or from said substrate, itself, (2) having a height of more than 1.5 micrometers, and (3) being spaced apart from each other to enable the dissipation of gases generated during said photoengraving processes from the space between said substrate and a said supported mask.

2. A semiconductor wafer for having formed thereon a plurality of individual integrated circuits by the use of masks and photoengraving processes, said wafer comprising:

a substrate including a plurality of areas each for the formation of one of said integrated circuits and dicing lines surrounding each of said areas; and means on said dicing lines and separated from said circuits for supporting a mask above the surface of said substrate during said photoengraving processes at a height sufficient to permit the dissipation of gases evolved during said photoengraving processes away from the area between said mask and said substrate.

3. A semiconductor wafer of claim 2 wherein said supporting means comprises a plurality of spaced-apart projections.

4. A semiconductor wafer according to claim 3, in which the projections each have a height of more than 1.5 μm.

5. A semiconductor wafer according to claim 3, in which the substrate is silicon.

6. A semiconductor wafer according to claim 3, in which the projections are made from the substrate.

7. A semiconductor wafer according to claim 3, in which the projections are made from an oxidation film formed on the substrate.

8. A semiconductor wafer according to claim 7, in which the oxidation film is silicon dioxide.

* * * * *